United States Patent
Zheng et al.

(10) Patent No.: US 7,042,222 B2
(45) Date of Patent: May 9, 2006

(54) PHASED ARRAY KNEE COIL

(75) Inventors: Tsinghua Zheng, Aurora, OH (US);
Shuren Zhao, Aurora, OH (US);
Robert Anderson, Mayfield Heights, OH (US); Labros Petropoulos, Auburn, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/993,558

(22) Filed: Nov. 19, 2004

(65) Prior Publication Data

US 2005/0134271 A1    Jun. 23, 2005

Related U.S. Application Data

(60) Provisional application No. 60/571,223, filed on May 14, 2004, provisional application No. 60/523,660, filed on Nov. 19, 2003.

(51) Int. Cl.
*G01V 3/00* (2006.01)
(52) U.S. Cl. ...................... 324/318; 324/319
(58) Field of Classification Search ........... 324/318, 324/322, 319, 309, 307, 300; 600/422
See application file for complete search history.

(56) References Cited

U.S. PATENT DOCUMENTS

| | | | | | |
|---|---|---|---|---|---|
| 5,430,378 | A | * | 7/1995 | Jones | 324/318 |
| 5,565,779 | A | * | 10/1996 | Arakawa et al. | 324/318 |
| 5,619,996 | A | * | 4/1997 | Beresten | 600/422 |
| 5,666,055 | A | * | 9/1997 | Jones et al. | 324/318 |
| 5,998,999 | A | * | 12/1999 | Richard et al. | 324/318 |
| 6,040,697 | A | * | 3/2000 | Misic | 324/318 |
| 6,404,201 | B1 | * | 6/2002 | Boskamp | 324/318 |
| 6,498,489 | B1 | * | 12/2002 | Vij | 324/322 |
| 6,512,374 | B1 | * | 1/2003 | Misic et al. | 324/319 |
| 6,833,705 | B1 | * | 12/2004 | Misic | 324/322 |
| 6,842,001 | B1 | * | 1/2005 | Ikezaki | 324/309 |

\* cited by examiner

*Primary Examiner*—Brij B. Shrivastav

(74) *Attorney, Agent, or Firm*—Carl B. Horton, Esq.; Armstrong Teasdale LLP

(57) ABSTRACT

A phased-array knee coil is provided and includes a transmit coil array and a receive coil array having a plurality of coils configured to provide a first imaging mode and a second imaging mode.

13 Claims, 3 Drawing Sheets

PHASED ARRAY KNEE COIL

CROSS REFERENCE TO RELATED APPLICATIONS

This application claims priority to and the benefit of the filing date of U.S. Provisional Application No. 60/571,223, filed on May 14, 2004 and U.S. Provisional Application No. 60/523,660, filed on Nov. 19, 2003, both of which are hereby incorporated by reference in their entirety.

BACKGROUND OF THE INVENTION

This invention relates generally to medical imaging systems, and more particularly, to a knee coil array for a Magnetic Resonance Imaging (MRI) system.

MRI or Nuclear Magnetic Resonance (NMR) imaging generally provides for the spatial discrimination of resonant interactions between Radio Frequency (RF) waves and nuclei in a magnetic field. Specifically, MRI utilizes hydrogen nuclear spins of the water molecules in the human body, which are polarized by a strong, uniform, static magnetic field of a magnet. This magnetic field is commonly referred to as $B_0$ or the main magnetic field. The magnetically polarized nuclear spins generate magnetic moments in the human body. The magnetic moments point in the direction of the main magnetic field in a steady state, but produce no useful information if these magnetic moments are not disturbed by any excitation.

The generation of NMR signals for MRI data acquisition is accomplished by exciting the magnetic moments with a uniform RF magnetic field. This RF magnetic field is commonly referred to as the $B_1$ field or the excitation field. The $B_1$ field is produced in the imaging region of interest by an RF transmit coil that is usually driven by a computer-controlled RF transmitter with a power amplifier. During excitation, the nuclear spin system absorbs magnetic energy and the magnetic moments precess around the direction of the main magnetic field. After excitation, the precessing magnetic moments will go through a process of Free Induction Decay (FID), releasing their absorbed energy and returning to the steady state. During FID, NMR signals are detected by the use of a receive RF coil, which is placed in the vicinity of the excited volume of the human body.

The NMR signal is the secondary electrical voltage (or current) in the receive RF coil that has been induced by the precessing magnetic moments of the human tissue. The receive RF coil can be either the transmit coil operating in a receive mode or an independent receive-only RF coil. The NMR signal is used for producing MR images by using additional pulsed magnetic gradient fields, which are generated by gradient coils integrated inside a main magnet system. The gradient fields are used to spatially encode the signals and selectively excite a specific volume of the human body. There are usually three sets of gradient coils in a standard MRI system that generate magnetic fields in the same direction of the main magnetic field, and varying linearly in the imaging volume.

In MRI, it is desirable for the excitation and reception to be spatially uniform in the imaging volume for better image uniformity. In known MRI systems, the best excitation field homogeneity is usually obtained by using a whole-body volume RF coil for transmission. The whole-body transmit coil is the largest RF coil in the system. A large coil, however, produces lower signal-to-noise ratio (SNR or S/N) if it is also used for reception, mainly because of its greater distance from the signal-generating tissues being imaged.

Because a high signal-to-noise ratio is very desirable in MRI, special-purpose coils have been used for reception to enhance the S/N ratio from the volume of interest. In practice, a well-designed specialty or special-purpose RF coil has the following functional properties: high S/N ratio, good uniformity, high unloaded quality factor (Q) of the resonance circuit, and high ratio of the unloaded to loaded Q factors. Additionally, the coil should be mechanically designed to facilitate patient handling and comfort, as well as to provide a protective barrier between the patient and the RF electronics.

The SNR advantage provided by using an array of small RF coils to image a large volume is known. SNR usually increases with the reduction of coil size. For example, for knee imaging, the typical S/I coverage of a knee coil is about sixteen centimeters (cm). However, when imaging using a smaller field-of-view (FOV), for example, ten cm, and at the same resolution, the SNR will decrease due to the reduction of signal in each pixel. Thus, a decrease in sensitivity and image resolution results.

BRIEF DESCRIPTION OF THE INVENTION

In an exemplary embodiment, a phased-array knee coil for a Magnetic Resonance Imaging (MRI) system is provided. The phased-array knee coil includes a transmit coil array and a receive coil array having a plurality of coils configured to provide a first imaging mode and a second imaging mode.

In another exemplary embodiment, a phased-array knee coil for a Magnetic Resonance Imaging (MRI) system is provided. The phased-array knee coil includes a transmit coil array including a birdcage coil and a receive coil array including a plurality of lattice-shaped coil elements. Each of the lattice-shaped coil elements includes a plurality of coils configured to provide a first imaging mode and a second imaging mode, with the first and second imaging modes being user selectable to provide different imaging field-of-views.

In yet another exemplary embodiment, a method of providing a phased-array knee coil for a Magnetic Resonance Imaging (MRI) system includes providing a transmit coil array. The method further includes configuring a receive coil array having a plurality of coils to provide imaging operation in each of a first imaging mode and a second imaging mode, and in combination with the transmit coil array providing different fields-of-view for imaging in each of the first and second imaging modes.

DETAILED DESCRIPTION OF THE INVENTION

Various embodiments of the present invention provide a dual-coverage transmit/receive (T/R) phased array knee coil for a Magnetic Resonance Imaging System (MRI). The T/R phased array knee coil generally provides a first mode of operation or first imaging mode, in particular a zoom mode, that has a first S/I coverage, for example, about ten cm, and a second mode of operation or second imaging mode, in particular, a full coverage mode, having a second S/I coverage, for example, about sixteen cm. Smaller field-of-view (FOV) knee imaging can be performed without loss of SNR. Thus, a T/R phased array knee coil array is provided that is configured having a first mode of operation and a second mode operation, with a corresponding field-of-view provided for each mode of operation.

Figure 1:
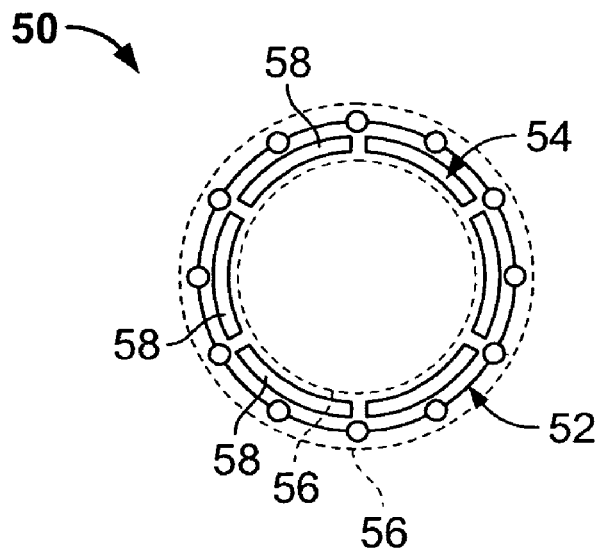
FIG. 1 is a plan view of a transmit/receive (T/R) phased array knee coil in accordance with an exemplary embodiment of the invention.

Specifically, and as shown in FIG. 1, the dual-coverage T/R phased array knee coil 50 generally includes a transmit coil array 52 and an array of receive coils 54. In an exemplary embodiment, the transmit coil array 52 is a twelve rung or element quadrature birdcage coil that is used to generate a uniform transmit $B_1$ field. In this exemplary embodiment, the array of receive coils 54 is an array of six individual lattice-shaped coil elements 58 (shown in FIG. 2) for receiving MRI signals. The T/R phased array knee coil 50 also includes a coil enclosure 56, as is known, such as, for example, a former.

Figure 2:
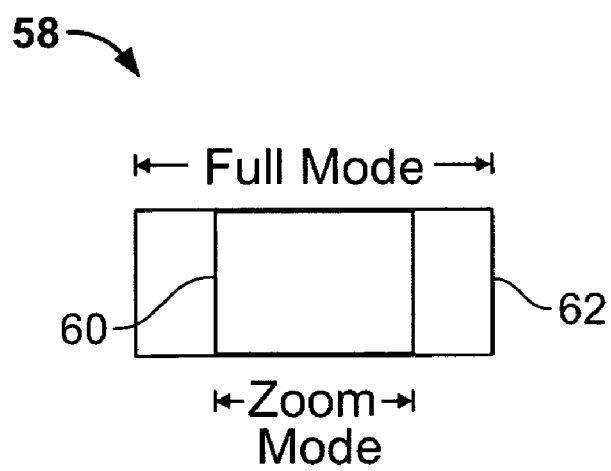
FIG. 2 is a schematic representation of a receive coil of the T/R phased array knee coil of FIG. 1 in accordance with an exemplary embodiment of the invention.

An exemplary embodiment of a lattice-shaped coil element 58 is shown in more detail in FIG. 2. The lattice-shaped coil element 58 is essentially a dual-coverage coil array having a first coil element 60 (e.g., an inner coil loop) configured to provide a zoom mode of operation and a second coil element 62 (e.g., an outer coil loop) configured to provide a full mode of operation. In an exemplary embodiment, the width of each of the first and second coil elements 60 and 62 is about twelve centimeters (cm), and the lengths of the first and second coil elements 60 and 62 are about ten cm and about sixteen cm, respectively. In this embodiment, the first coil element 60 is positioned within the second coil element 62, for example, centered between the ends of the second coil element 62. It should be noted that although the first and second coil elements 60 and 62 are shown as loop coils, other coil configurations may be implemented as desired or needed.

Figure 3:
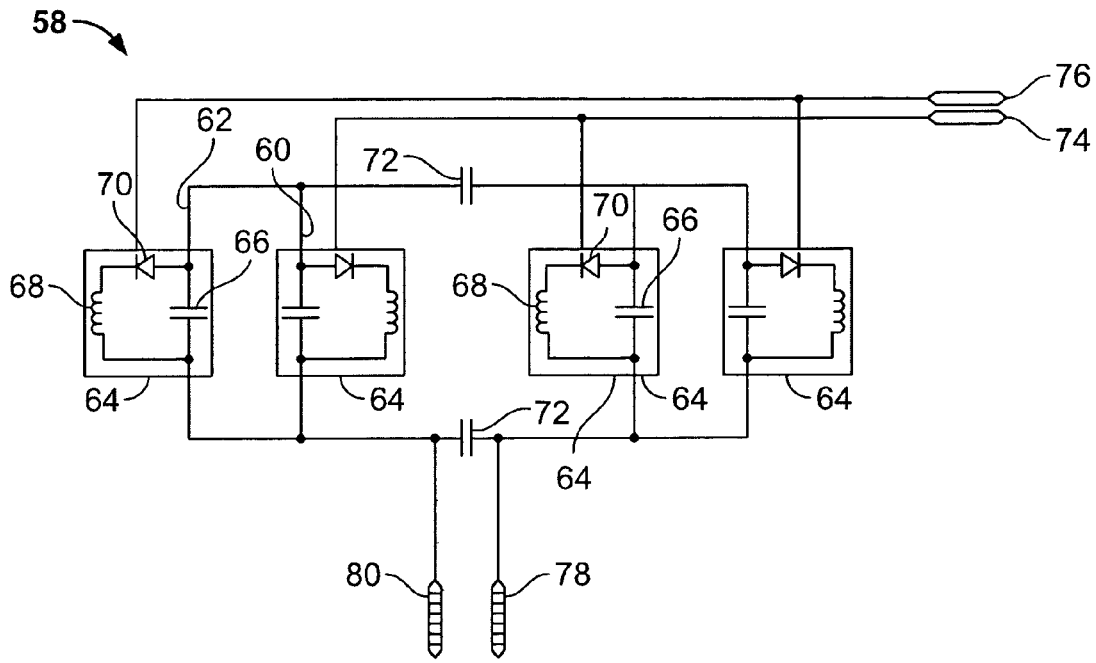
FIG. 3 is a schematic diagram of a control arrangement in accordance with an exemplary embodiment of the invention to control the receive coil of FIG. 2.

In operation, the first and second coil elements 60 and 62 can be activated separately using DC bias current to create two different imaging modes. In particular, and as shown in FIG. 3, decoupling circuits 64 may be provided in connection with each of the first and second coil elements 60 and 62 as is known and to selectively activate and deactivate (e.g., decouple) the first and second coil elements 60 and 62. For example, each of the decoupling circuits 64 may include a capacitor 66, inductor 68 and diode 70 in series and configured as desired or needed in a known manner, to provide decoupling of the corresponding coil elements. The values of the components of the decoupling circuits 64 may be provided as desired or needed, for example, based on the requirements of the particular MRI system. Additionally, tuning capacitors 72 may be provided to tune the first and second coil elements 60 and 62.

A first control line 74 and a second control line 76 are provided to selectively activate and deactivate (e.g., decouple) the first and second coil elements 60 and 62, respectively, using the corresponding decoupling circuits 64. For example, a coil configuration file may be preprogrammed (e.g., preprogrammed to selectively control the activation of the coil elements) and used by the MRI system (not shown) to which the T/R phased array knee coil 50 is connected to control the first and second coil elements 60 and 62 while imaging an object, for example, a patient. Further, RF outputs 78 and 80 output received signals (e.g., MRI image data) from the first and second coil elements 60 and 62.

In an exemplary embodiment, when the second coil element 62 is activated, the T/R phased array knee coil 50 can be used, for example, for normal knee imaging with a FOV of about sixteen cm (e.g. full imaging mode of operation). When the first coil element 60 is activated, the effective FOV of the T/R phased array knee coil 50 is reduced to, for example, ten cm (e.g., zoom imaging mode of operation), with an SNR higher than that acquired using the second coil element 62. Thus, a user can select the "full mode" for large FOV imaging or "zoom mode" for high resolution, small FOV imaging. It should be noted that adjacent loop elements are overlapped to minimize coupling, and the coil elements are further isolated with each other using low input impedance preamplifiers 82 as shown in FIG. 4.

Figure 4:
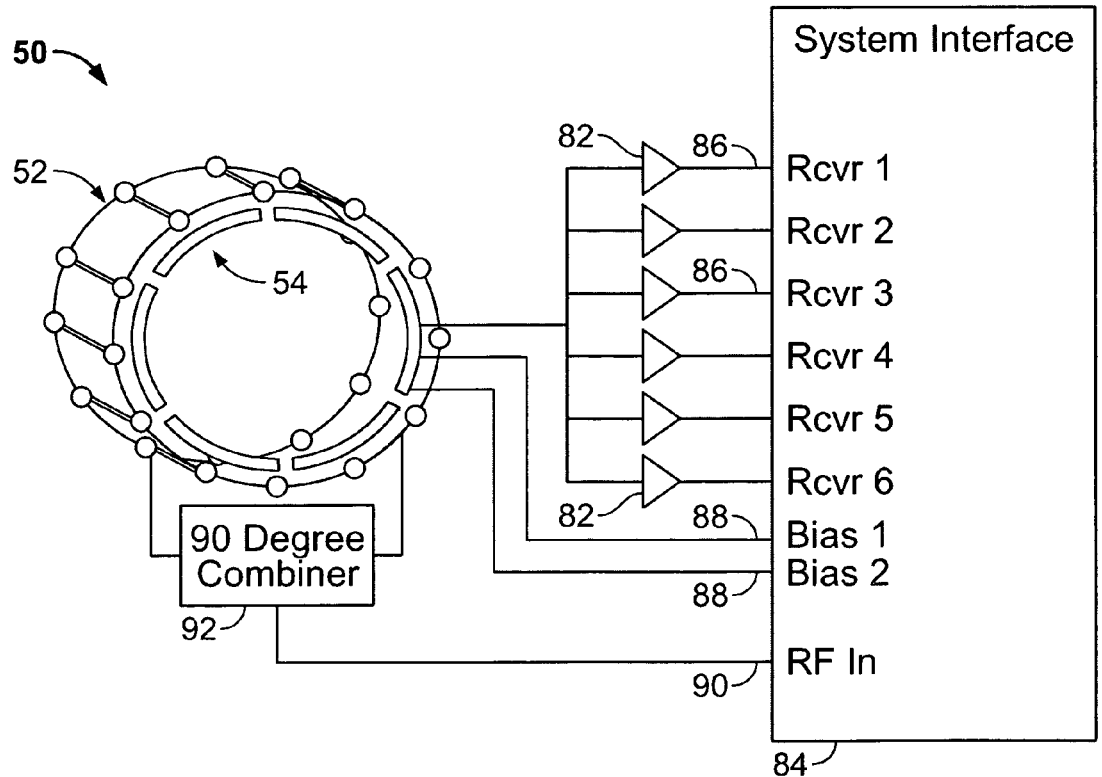
FIG. 4 is a block diagram of a T/R phased array knee coil in accordance with an exemplary embodiment of the invention connected to a system interface.

Referring more particularly to FIG. 4, the T/R phased array knee coil 50 may be connected to an MRI system (not shown) having a six channel system interface 84 (e.g., GE Excite 1.5T System Interface), with a separate receive channel 86 connected to each of the six lattice-shaped coil elements 58. The system interface 84 also includes two bias control lines 88 to control the switching of the decoupling circuits 64, for example, using a coil configuration file stored in the MRI system and/or a user input. For example, based on a user input, a particular coil configuration file may be selected to control the T/R phased array knee coil 50 in a particular imaging mode (e.g., user control of mode of operation using controls on an MRI scanner). An RF in control line 90 also may be provided in connection with a ninety (90) degree combiner 92 to control the transmit coil array 52.

Thus, by using the "zoom mode" of the T/R phased array knee coil 50 on a small FOV (e.g., about ten cm) applications, improved SNR is provided (e.g., 25–30% increase in SNR).

The following table shows the SNR comparison between the full mode and the zoom mode of the knee coil using NEMA method. The scan protocol is: FSE-XL, 2D, Axial Plane, TE 17, TR500, Echo 4, BW: 15.6 KHz, Freq 256, Phase 256, Nex 1, Freq Dir A/P, Center: Peak, AutoShim: on, FOV 24, Slice Thickness: 3.0 mm.

|  | Zoom Mode | Full Mode |
| --- | --- | --- |
| Signal | 2176.8 | 1942.4 |
| Noise | 5.63 | 6.44 |
| SNR | 386.6 | 301.6 |

Figure 5:
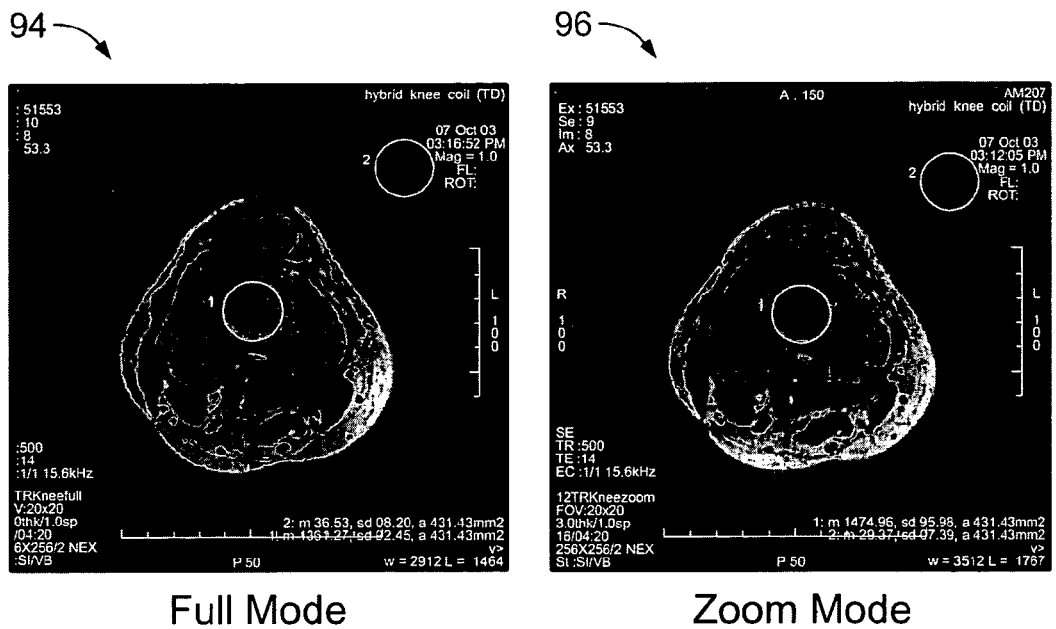
FIG. 5 are images showing full mode and zoom mode imaging with a T/R phased array knee coil in accordance with an exemplary embodiment of the invention.

Thus, various embodiments of the present invention provide a T/R phased array knee coil having a transmit coil (e.g., a twelve rung birdcage coil) and an array of surface coils configured as a receive coil. In one exemplary embodiment, an array of lattice-shaped dual coverage coils are provided. This array provides two imaging modes: (i) "full mode," for example, for normal knee imaging and (ii) "zoom mode," for example, for high resolution, small FOV imaging. An exemplary full mode image 94 and a zoom mode image 96 are shown in FIG. 5. The imaging mode is user selectable, for example, based on the type of application.

While the invention has been described in terms of various specific embodiments, those skilled in the art will recognize that the invention can be practiced with modification within the spirit and scope of the claims.

What is claimed is:

1. A phased-array knee coil for a Magnetic Resonance Imaging (MRI) system, the phased-array knee coil comprising:
   a transmit coil array; and
   a receive coil array having a plurality of coils configured to provide a first imaging mode and a second imaging mode and wherein the plurality coils each include a first coil element defining an inner coil loop and a second coil element defining an outer coil loop with the first coil element providing the first imaging mode and the second coil element providing the second imaging mode, the first imaging mode being a zoom imaging mode and the second imaging mode being a full imaging mode.

2. A phased-array knee coil in accordance with claim 1 wherein each of the plurality of coils of the receive coil array are configured as lattice-shaped coil elements.

3. A phased-array knee coil in accordance with claim 1 wherein the transmit coil array comprises a twelve element quadrature birdcage coil.

4. A phased-array knee coil in accordance with claim 1 wherein the receive coil array comprises six lattice-shaped coils.

5. A phased-array knee coil in accordance with claim 1 wherein the transmit and receive coil arrays are configured to image a human knee.

6. A phased-array knee coil in accordance with claim 1 wherein the first and second imaging modes are configured to provide different imaging field-of-views.

7. A phased-array knee coil for a Magnetic Resonance Imaging (MRI) system, the phased-array knee coil comprising:
   a transmit coil array including a birdcage coil; and
   a receive coil array including a plurality of lattice-shaped coil elements, each of the lattice-shaped coil elements including a plurality of coils configured to provide a first imaging mode and a second imaging mode, the first and second imaging modes user selectable to provide different imaging field-of-views and wherein each of the lattice-shaped coil elements comprises an inner coil element and an outer coil element, the inner coil element conflaured to provide the first imaging mode and the outer coil element configured to provide the second imaging mode, the first imaging mode being a zoom imaging mode and the second imaging mode being a full imaging mode.

8. A phased-array knee coil in accordance with claim 7 wherein the birdcage coil comprises twelve elements and the receive coil array comprises six lattice-shaped coil elements.

9. A phased-array knee coil in accordance with claim 7 wherein each of a width of each of the inner and outer coil elements is about the same, and a length of the outer coil element is greater than a length of the inner coil element.

10. A phased-array knee coil in accordance with claim 7 wherein the inner coil elements are positioned within the outer coil elements.

11. A phased-array knee coil in accordance with claim 7 wherein the transmit coil array and receive coil array are each configured in a generally cylindrical shape.

12. A method of providing a phased-array knee coil for a Magnetic Resonance Imaging (MRI) system, the method comprising:
   providing a transmit coil array; and
   configuring a receive coil array having a plurality of coils to provide imaging operation in each of a first imaging mode and a second imaging mode, and in combination with the transmit coil array providing different fields-of-view for imaging in each of the first and second imaging modes and;
   configuring the plurality of coils as an inner coil loop and an outer coil loop, the inner coil loop providing the first imaging mode and the outer coil loop providing the second imaging mode, and wherein the first imaging mode is a zoom imaging mode and the second imaging mode is a full imaging mode.

13. A method in accordance with claim 12 further comprising configuring the plurality of coils of the receive coil array as lattice-shaped coil elements.

* * * * *